(12) United States Patent
Tomisawa

(10) Patent No.: US 7,143,331 B2
(45) Date of Patent: Nov. 28, 2006

(54) ERROR CORRECTION APPARATUS FOR PERFORMING CONSECUTIVE READING OF MULTIPLE CODE WORDS

(75) Inventor: Shin-ichiro Tomisawa, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 453 days.

(21) Appl. No.: 10/105,010

(22) Filed: Mar. 22, 2002

(65) Prior Publication Data

US 2002/0144206 A1    Oct. 3, 2002

(30) Foreign Application Priority Data

Mar. 22, 2001    (JP)    ............... 2001-082298

(51) Int. Cl.
*G11C 29/00*    (2006.01)
(52) U.S. Cl. ...................... 714/763; 714/799
(58) Field of Classification Search ................ 714/752, 714/754, 757, 758, 763, 799, 807–810; 710/10
See application file for complete search history.

(56) References Cited

U.S. PATENT DOCUMENTS

| | | | | |
|---|---|---|---|---|
| 5,612,922 A | * | 3/1997 | McLaury | 365/230.05 |
| 5,721,860 A | * | 2/1998 | Stolt et al. | 711/105 |
| 6,044,484 A | * | 3/2000 | Chung | 714/766 |
| 6,158,038 A | * | 12/2000 | Yamawaki et al. | 714/755 |
| 6,185,629 B1 | * | 2/2001 | Simpson et al. | 710/10 |
| 6,243,845 B1 | * | 6/2001 | Tsukamizu et al. | 714/769 |
| 6,332,206 B1 | * | 12/2001 | Nakatsuji et al. | 714/755 |
| 6,591,349 B1 | * | 7/2003 | Steinman et al. | 711/154 |
| 6,651,208 B1 | * | 11/2003 | Tran et al. | 714/755 |

FOREIGN PATENT DOCUMENTS

EP    0939403 A2    9/1999

* cited by examiner

*Primary Examiner*—Albert Decady
*Assistant Examiner*—John P. Trimmings
(74) *Attorney, Agent, or Firm*—Fish & Richardson P.C.

(57) ABSTRACT

An error correction apparatus for performing an error correction process on digital data that is stored in a buffer memory and includes multiple code words. The device includes a memory access circuit for controlling reading and writing of the code words to the buffer memory. Operational circuits perform a syndrome calculation with each of the multiple code words read from the buffer memory. The memory access circuit consecutively reads the multiple code words from the buffer memory and distributes the code words to the operational circuits.

11 Claims, 11 Drawing Sheets

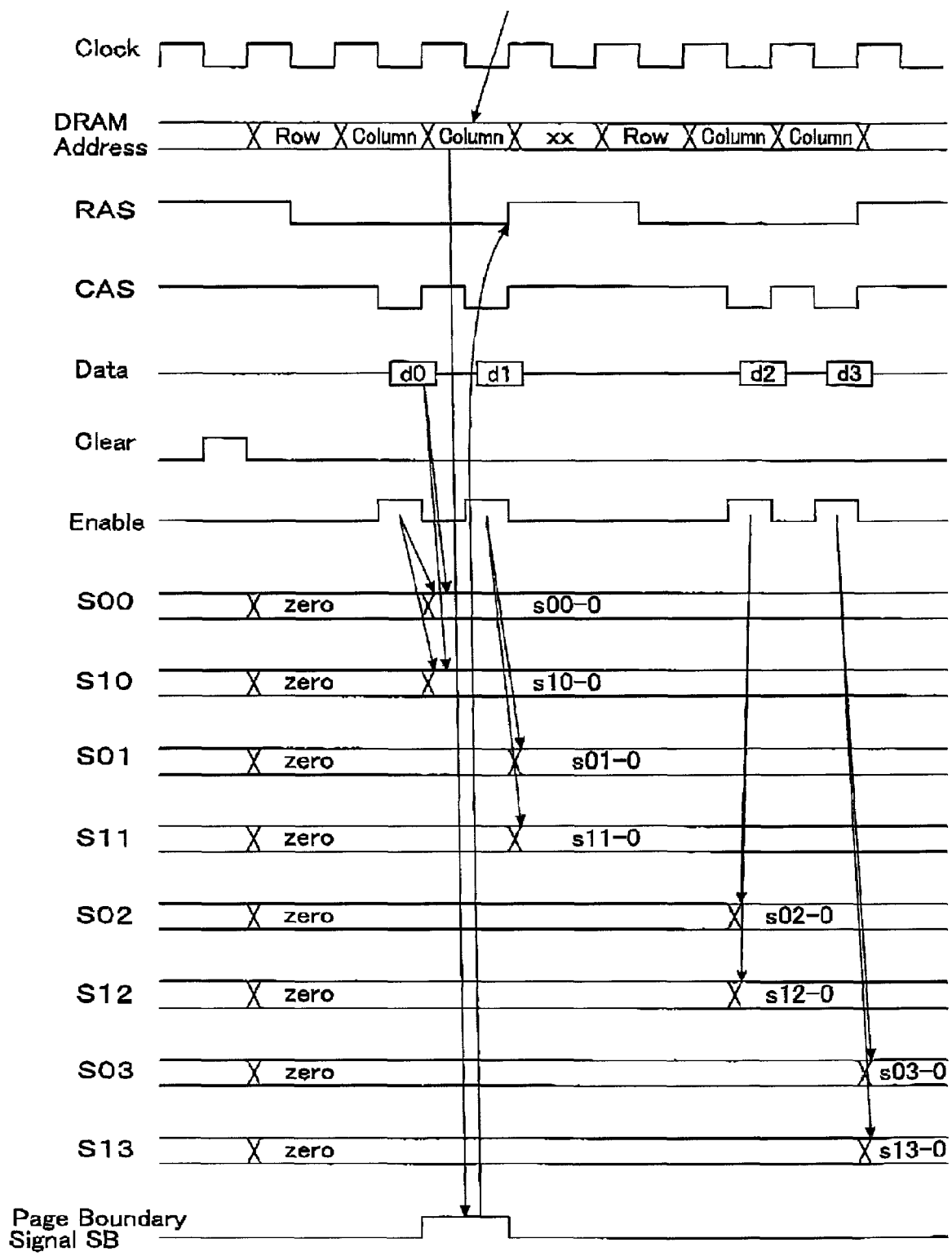

ously and the data of FIGS. 1(c) and 1(d) are written to the memory cells starting from lower addresses. For example, referring to FIG. 3, in row 0 of sector 1, the synchronizing data is written in column 1 to column 5. Data 0 of FIGS. 1(c) and 1(d) is written to row 0 column 6. Data 1 of FIGS. 1(c) and 1(d) is written to row 0 column 7.

ERROR CORRECTION APPARATUS FOR PERFORMING CONSECUTIVE READING OF MULTIPLE CODE WORDS

BACKGROUND OF THE INVENTION

The present invention relates to an error correction apparatus, and more particularly, to an error correction apparatus for calculating the syndrome of the data stored in a buffer memory, which includes a random access memory, to correct errors.

FIGS. 1(a) to 1(d) illustrate the data format of a compact disc ROM (CD-ROM) As shown in FIG. 1(a), CD-ROM data is formed from multiple sectors, each of which has 2352 bytes. Each sector includes 12 bytes of synchronizing data, 4 bytes of a header, 2048 bytes of user data, 4 bytes of error detection code (EDC) data, 8 bytes of ZERO data, and 276 bytes of error correction code (ECC) data.

The data excluding the 12 bytes of synchronizing data undergoes error correction with an ECC. When the error correction is performed, the 2340 bytes of data, which do not include the synchronizing data, are alternately divided into LS bytes and MS bytes. This generates data including 1170 LS bytes (FIG. 1(c)) and 1170 MS bytes (FIG. 1(d)). Further, referring to FIG. 2, the 1170 LS bytes and the 1170 MS bytes are coded in two directions, a P sequence (P group) direction and a Q sequence (Q group) direction.

For the first 1032 bytes of data, a F parity, which consists of 2 bytes of data, is added to every 24 bytes of data in the P sequence direction. Further, 43 code words (P codes), which are coded in the P sequence direction, are configured. As apparent from FIG. 2, the position of the $j^{th}$ symbol for the $i^{th}$ code word of the P codes is represented by "i+43j (i=0, 1, . . . 42: j=0, 1, . . . 25).

For the first 1032 bytes of data and the 86 bytes of P parities (2 bytes×43), a Q-parity, which consists of 2 bytes of data, is added to every 43 bytes of data. Further, 26 code words (Q words), which are coded in the Q sequence direction, are configured. The position of the $j^{th}$ symbol for the $i^{th}$ code word of the Q codes is represented by "43i|44j" mod (remainder) 1118 (i=0, 1, . . . 25: J=0, 1, . . . 42).

The symbols configuring the P codes and the Q codes are read from a memory to calculate a syndrome and determine whether the data includes errors. The detection of errors using the code words is performed as described below.

A compact disc (CD) signal processing circuit performs a decoding process, such as error correction, on the data read from a CD-ROM in the same manner as CD audio. The processed data is stored as the CD-ROM data of FIG. 1(a) in a dynamic random access memory (DRAM), which is a buffer memory. FIG. 3 illustrates the CD-ROM data stored in the DRAM.

More specifically, with regard to the CD-ROM sector data of FIG. 1(a), the 1176 bytes of data (6 bytes of data in the 12 bytes of synchronizing data and the 1170 LS bytes or MS bytes) are written along the addresses of the DRAM. FIG. 3 shows an example in which column addresses have 256 bytes. A row address is incremented in cycles of 256 bytes. The MS byLes arid LS bytes are actually written along each address in units of two bytes in the DRAM. The memory cells of the same row are connected to the same word line in the DRAM.

The writing of data is basically performed in accordance with the order of a data stream when the CD-ROM data is transferred (i.e., the data stream of the CD-ROM data of FIG. 1(a)). However, the data is actually divided into 1170 LS bytes and 1170 MS bytes. Thus, the 6 bytes of synchro- The CD-ROM data of each sector is read from the DRAM in units of code words. As an example, the reading order of the P codes will now be discussed. As shown in FIG. 4, the CD-ROM data is read in code word units of 26 bytes. The symbols forming the read code words are used to calculate the syndrome. The syndrome is set so that it has a predetermined value when each piece of data (code word) does not include an error. Thus, the calculation of the syndrome enables determination of whether a code word includes an error.

When it is determined that the code word includes an error, the value of the error and the location of the error are obtained based on the syndrome. Then, data is read again from the location including an error. An exclusive OR operation is performed with the read data and the value of the error to generate correct data. The erroneous data is then rewritten by the correct data.

After the error correction, the EDC data of FIG. 1(a) is used to check whether the error correction was performed properly. The data that has undergone the error correction process and the check for erroneous corrections is transferred from the DRAM to the host computer.

In this manner, the code words are used to perform error correction. However, the symbols are stored in the memory cell of the DRAM at non-consecutive addresses. Thus, the time for accessing the memory cell becomes long when reading the code words. More specifically, to read a symbol from the DRAM, three operations, which include precharge, row address designation, and column address designations are necessary. Thus, three clock signals must be provided each time a symbol is read. This hinders with increasing the speed of the error correction process. Such problem occurs in an error correction apparatus that stores data temporarily in a buffer memory and then sequentially reads symbols while performing error detection or error correction.

SUMMARY OF THE INVENTION

A perspective of the present invention is an error correction apparatus for performing an error correction process on digital data that is stored in a buffer memory and includes multiple code words. The apparatus includes a memory access circuit for controlling reading and writing of the code words to the buffer memory. A plurality of operational circuits perform a syndrome calculation with each of the multiple code words read from the buffer memory, The memory access circuit consecutively reads the multiple code words from the buffer memory and distributes bile code words to the plurality of operational circuits.

A further perspective of the present invention is an error correction apparatus for performing an error correction process on digital data that is stored in a buffer memory and includes multiple code words. The apparatus includes a memory access circuit connected to the buffer memory for reading and writing the code words to the buffer memory in accordance with an address signal. An address generation circuit generates the address signal to designate an address of the code words read from and written to the buffer memory and to provide the address signal to the memory access circuit. A timing generation circuit is connected to the address generation circuit for generating a timing signal to control the address generation circuit so that the address signal is generated to read the code words from the buffer memory. A syndrome generation circuit generates multiple syndromes in parallel in correspondence with the multiple code words by processing the code words of the digital data read from the buffer memory.

A further perspective of the present invention is a method for performing an error correction process on digital data that is stored in a buffer memory and includes multiple code words. The method includes consecutively reading the code words of the digital data from the buffer memory, generating multiple syndromes in parallel by processing the code words of the digital data read from the buffer memory, and performing the error correction process on the digital data using the multiple syndromes.

A further perspective of the present invention is a method for performing an error correction process on digital data that is stored in a buffer memory and includes multiple code words. The method includes generating an address signal to consecutively read the code words from the buffer memory, consecutively reading the code words of the digital data from the buffer memory in accordance with the address signal, generating multiple syndromes in parallel by processing the code words read from the buffer memory, and performing the error correction process on the digital data using the multiple syndromes.

Other perspectives and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 11 is a time chart illustrating the timing for reading a further code word of the error correction apparatus of FIG. 6.

DETAILED DESCRIPTION OF THE PREFERRED EMBODIMENTS

Figure 1:
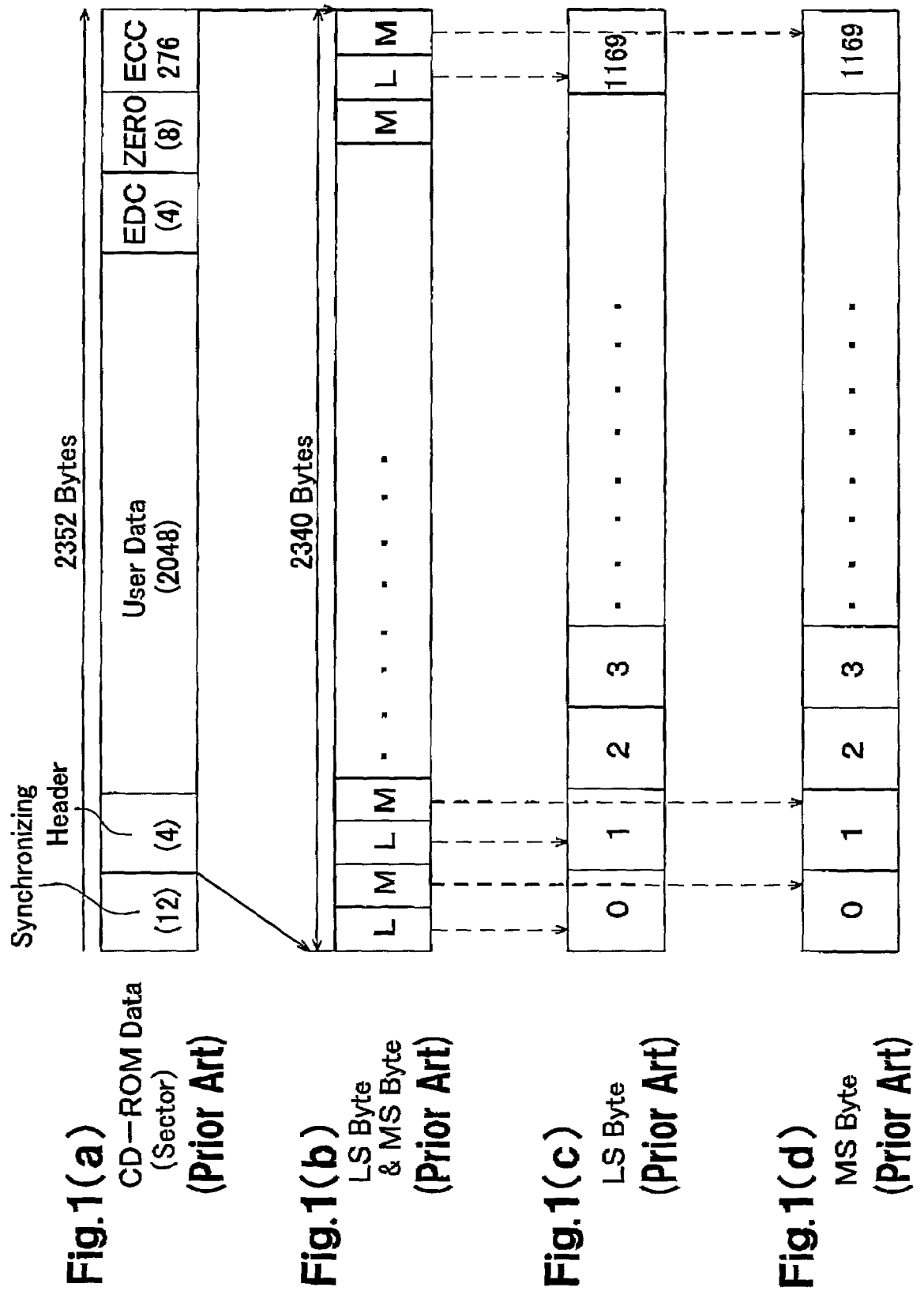
FIGS. 1(a) to 1(d) are diagrams illustrating the data format of a prior art CD-ROM.

In the drawings, like numerals are used for like elements throughout.

A preferred embodiment of an error correction apparatus according to the present invention will now be discussed with reference to the drawings. The error correction apparatus corrects errors using P codes of CD-ROM.

Figure 5:
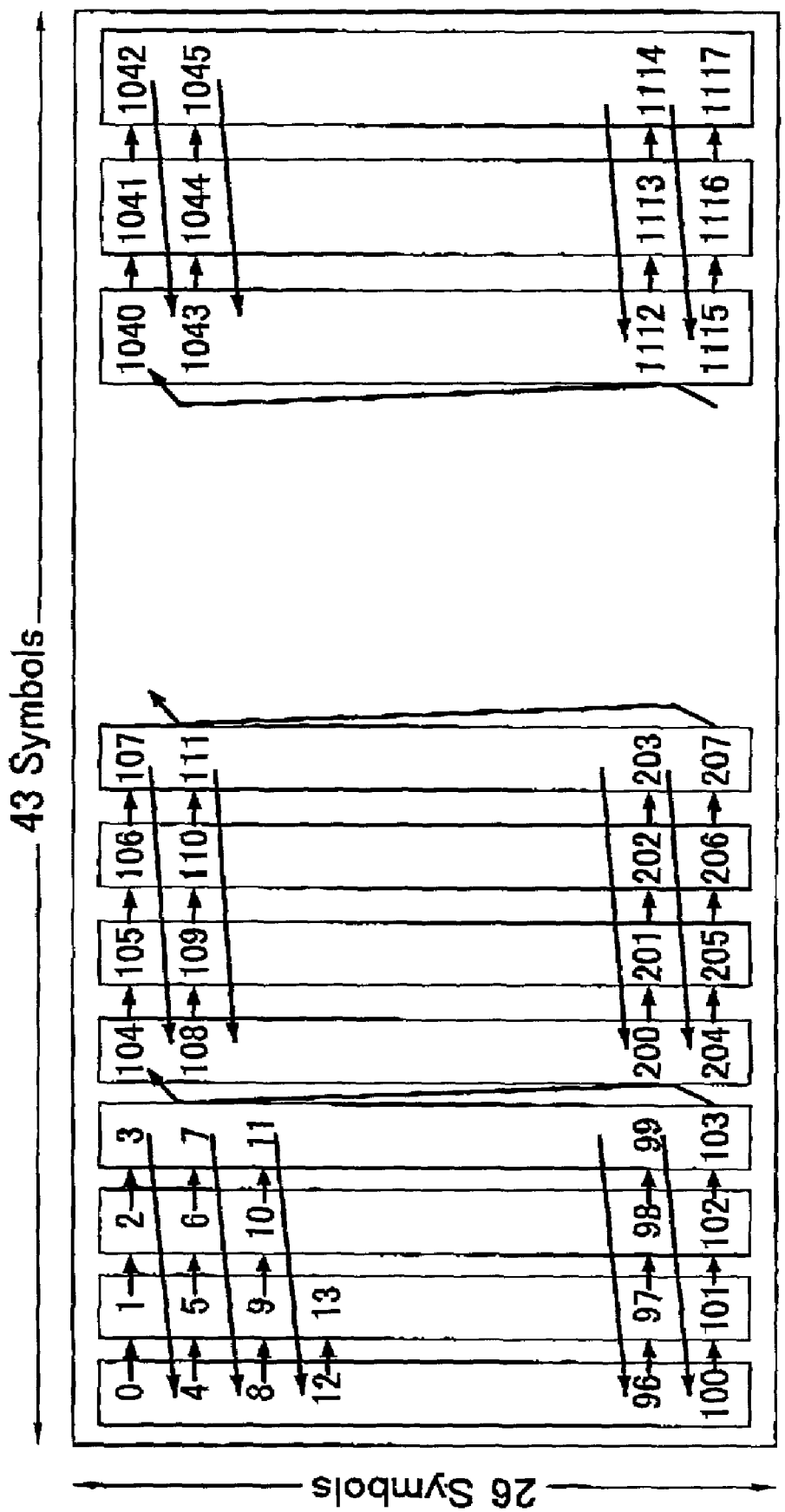
FIG. 5 is a diagram illustrating the order for reading a code word in the present invention.

Referring to FIG. 5, in the present invention, four code words are consecutively read from the DRAM when reading P codes. In other words, for the data of the MS bytes and the data of the LS bytes, the data corresponding to data numbers "i+43j", "(i+1)+43j", "(i+2)+43j", "(i+3)+43j", (i=0, 1, . . . 39: j=0, 1, . . . 25)" are read consecutively. With each of the four code words, when all of the symbols of the 26 bytes of "j=0 to 25" is read, the reading of the next four code words starts.

Each symbol of the four code words, which are adjacent to one another, is stored in the DRAM according to the adjacent address. Therefore, after designating a row address of the DRAM, a page mode technique, which changes the column addresses in accordance with each code word, is employed to read data from the DRAM. This requires only six clock signals to read four symbols. That is, one clock signal is allocated to precharge, one clock signal is allocated to row address designation, and four clock signals are allocated to column address designation. In this manner, four code words are read consecutively to reduce the number of clock signals. This enables high speed access.

As shown in FIG. 5, when reading four code words consecutively, after reading 1040 bytes of data of the LS bytes or the MS bytes, only three code words remain. Accordingly, three code words are read consecutively through the page mode technique for the data from byte 1041 to byte 1118.

Figure 3:
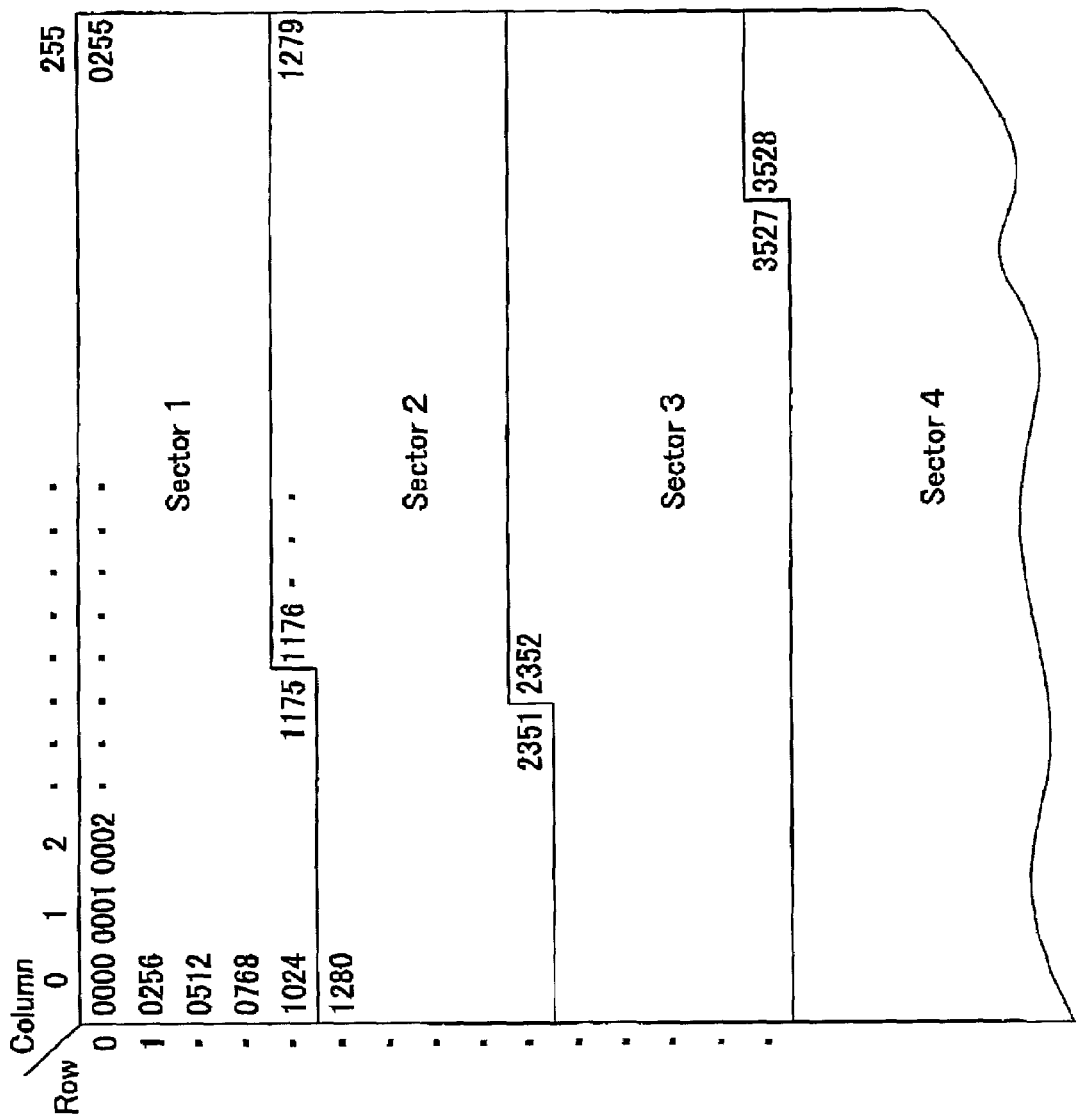
FIG. 3 is a diagram illustrating the prior art CD-ROM data stored in a DRAM.

When reading each symbol of the four code words, the row address is re-designated in an exceptional manner when the row address changes. In the preferred embodiment, the read address is detected to determine whether or not the column address of the DRAM of FIG. 3 is "255". When it is determined that the column address is "255", a new row address is designated.

Figure 6:
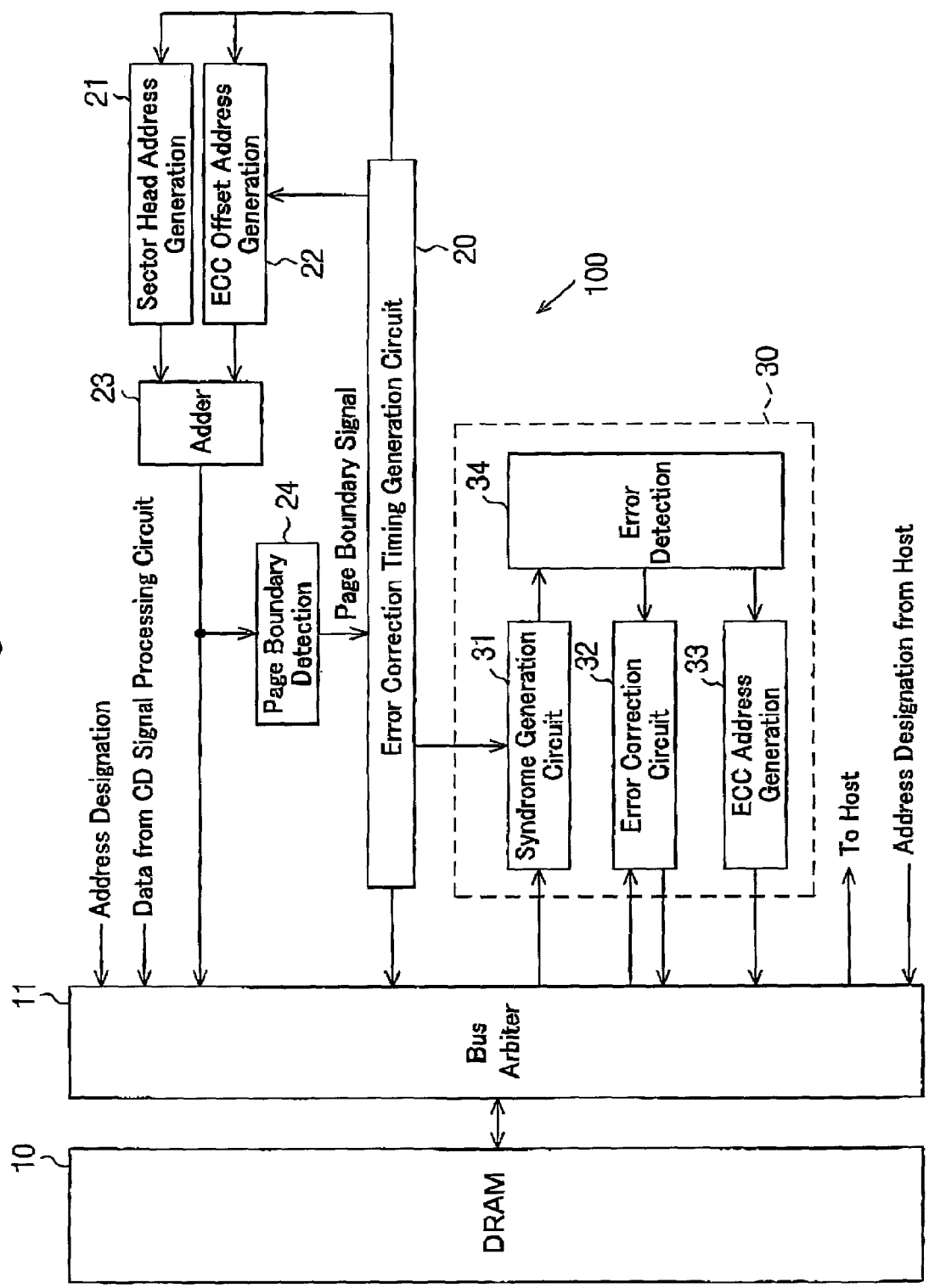
FIG. 6 is a schematic block diagram illustrating an error correction apparatus according to one embodiment of the present invention.

FIG. 6 is a schematic block diagram of an error correction apparatus 100 according to a preferred embodiment of the present invention. The error correction apparatus 100 includes a DRAM 10 for storing the CD-ROM data and a bus arbiter 11 for selecting the process that is to be performed in the DRAM 10. The DRAM 10 has the same configuration as that of the DRAM of FIG. 3.

The bus arbiter 11 is provided with the CD-ROM data transferred from a CD signal processing circuit (not shown) and the addresses of the DRAM 10. The bus arbiter 11 generates a row address strobe (RAS) signal and a column address strobe (column address strobe) signal to write data to the DRAM 10 at the designated address. The RAS signal, the CAS signal, and the CD-ROM data are written to the DRAM 10. When reading data from the DRAM 10, the RAS signal and the CAS signal are used to access the data subject to the reading.

The error correction apparatus 100 includes an error timing generation circuit 20 for reading write data in the manner shown in FIG. 5. When the error correction timing generation circuit 20 designates the data that is to he read from the DRAM 10, a sector head address generation circuit 21 designates the byte number corresponding to the head of the sector to which the data read from the DRAM 10 belongs. The head of the sector is designated using the sum of the bytes of data written to the DRAM 10. In other words, the head "0000" of sector 1 is designated when reading data that belongs to sector 1 of FIG. 3. The bead "2352" is designated when reading data belonging to sector 2. Further, the head "4704" of sector 3 is designated when reading data belonging to sector 3.

When the error correction Liming generation circuit 20 designates the data that is to be read from the DRAM 10, an ECC offset address generation circuit 22 designates the data that is subject to reading in accordance with the order in the sector. More specifically, the data subject to reading is basically designated in the order of "0000, 0001, 0002, 0003, 0043, 0044, 0045, 0046, 0086, . . . ". However, since the first 6 bytes of data from the head of each sector (the data of the LS bytes and the data of the MS bytes) are synchronizing data, the six bytes of data are not read to calculate the syndrome. Thus, the ECC offset address generation circuit 22 designates the data that is subject to reading in the order of "0006, 0007, 0008, 0009, 0049, 0050, 0051, 0052, 0092, . . . ".

Based on the byte number designated by the sector head address generation circuit 21 and the subject reading data designated by the ECC offset address generation circuit 22, an adder 23 calculates a designated value of the data reading order in the DRAM 10. In this case, the storing of data by the memory cell of the DRAM 10 in units of 2 bytes is considered. That is, with respect to the data of sector 1 of FIG. 3, designated values in the reading order of "0006, 0007, 0008, 0009, 0049, 0050, 0051, 0052, 0092, . . . " are calculated. With respect to the data of sector 2, designated values in the reading order of "1181, 1182, 1183, 1184, 1224, 1225, 2226, 2227, 2267, . . . ", which are obtained by sequentially adding 1175 bytes, are calculated.

When the designated value calculated by the adder 23 is provided to the bus arbiter 11, the bus arbiter 11 reads data from the DRAM 10 in accordance with the designated values. The designated values of the adder 23 are also provided to a page boundary detection circuit 24. The page boundary detection circuit 24 generates a page boundary signal when the column address of the DRAM 10 of the reading subject data is "255" (page boundary). The boundary is set when the lower eight bits of a binary designated value of the adder 23 are all "1". By detecting the page boundary in this manner, the error correction timing generation circuit 20 determines whether the row address of the DRAM 10 changes when four (or three) symbols corresponding to four (or three) code words are read.

When determining that the row address does not change, the error correction timing generation circuit 20 provides the bus arbiter 11 with an instruction for designating the row address once and then designating the column address corresponding to each code word of the reading subject four times (or three times) to read the code word. When determining that the row address changed, the error correction timing generation circuit 20 provides the bus arbiter 11 with an instruction for newly designating the row address after reading the data of the page boundary.

A CD-ROM decoding circuit 30 performs an error correction process on the data read from the DRAM 10. The CD-ROM decoding circuit 30 includes a syndrome generation circuit 31, an error correction circuit 32, an ECC address generation circuit 33, and an error detection circuit 34, The syndrome generation circuit 31 is provided with the data read from the DRAM 10 via the bus arbiter 11. An example for correcting an error in the preferred embodiment will now be discussed. The syndrome generation circuit 31 calculates the two syndromes of S0 and S1 for each code word. The syndrome S0 is calculated by performing the operation of $S0=S0\char`\^v(i)$ on all of the symbols of the code words. The initial value represents "0", v(i) represents the value of the $i^{th}$ symbol of the code word, and ^represents the adding of a Galois body. The syndrome S1 is calculated by performing the operation of $S0=(a*S0)\char`\^v(i)$ on the values of all of the symbols of the code words. The initial value is represented by "0", a represents a primitive element, and * represents the multiplying of a Galois body.

Figure 7:
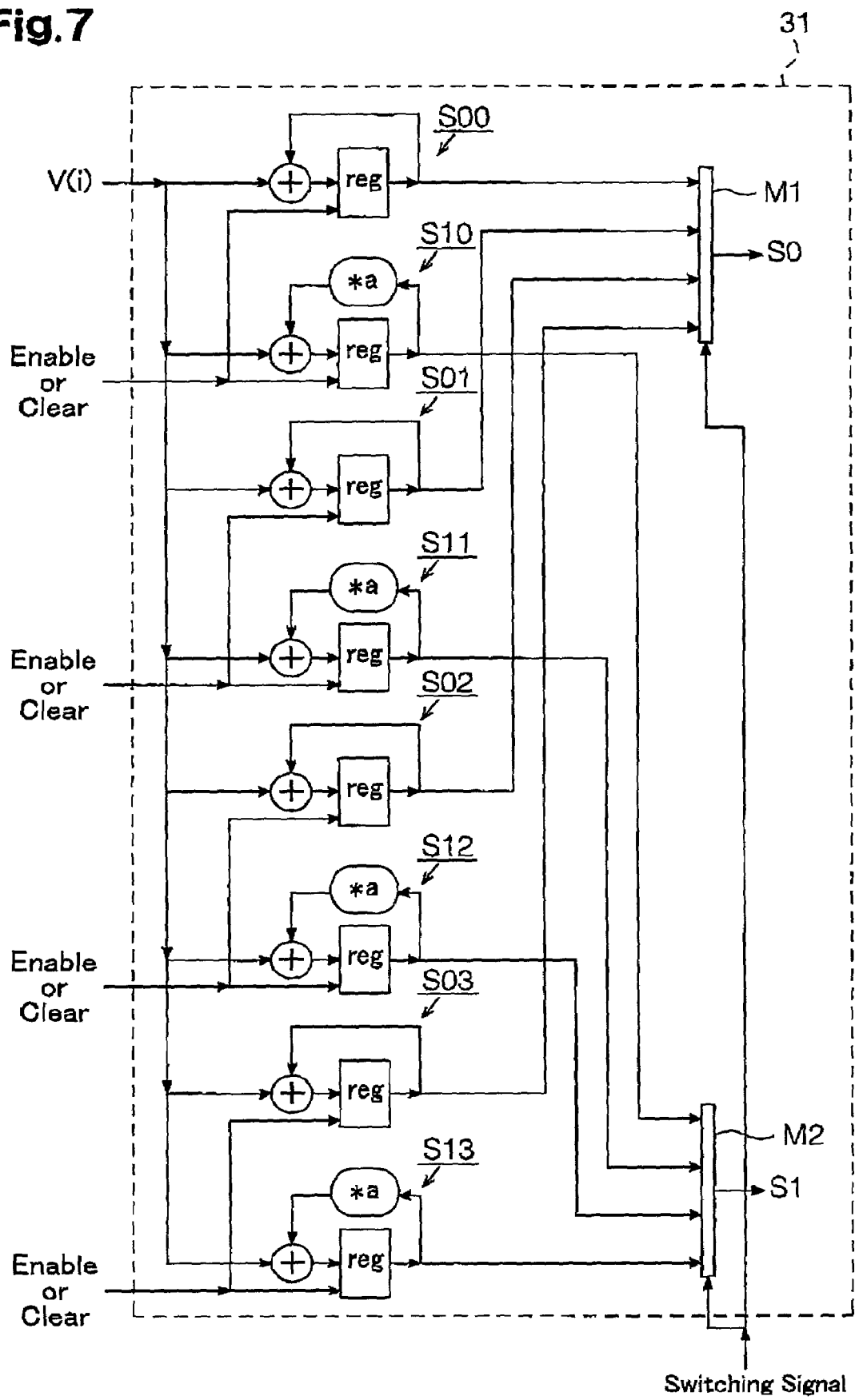
FIG. 7 is a schematic circuit diagram of a syndrome generation circuit of the error correction apparatus of FIG. 6.

The syndrome generation circuit 31 generates the syndromes S0, S1 of each of the four code words in parallel. Referring to FIG. 7, operational circuits S00, S01, S02, S03 calculate the syndrome S0, and operational circuits S10, S11, S12, S13 calculate the syndrome S1. In other words, when a register (represented as reg in FIG. 7) of an operational circuit corresponding to a code word is activated, the operational circuit performs a calculation with the symbol v (i) read from the DRAM 10. Each operational circuit calculates the syndrome by performing a calculation using the values v (i) (i=0, 1, . . . 25) of the 26 symbols. The syndrome S0 is transferred to the error detection circuit 34 via a multiplexer M1, and the syndrome S1 is transferred to the error detection circuit 34 via a multiplexer M2. The error detection circuit 34 determines whether all error code includes an error based on the syndromes S0, S1. If there is an error, the value of the error and the location of the error are calculated, and the error correction circuit 32 and the ECC address generation circuit 33 are provided with the calculated results.

The ECC address generation circuit 33 generates an address designating the location of an error and provides the bus arbiter 11 with the address. The bus arbiter 11 reads data from the erroneous location of the DRAM 10 and provides the read data to the error correction circuit 32. The error correction circuit 32 generates correct data from the erroneous data and the value of the error provided from the error detection circuit 34. The erroneous data of the DRAM 10 is rewritten to the correct data.

After the error correction, an EDC decoder block (not shown) checks whether error correction was properly performed using the EDC data of FIG. 1(a) After such series of processes are performed, when a host computer (not shown) instructs the bus arbiter 11 to transfer data, the bus arbiter 11 reads data from the DRAM 10 and transfers the read data to the host computer.

Figure 8:
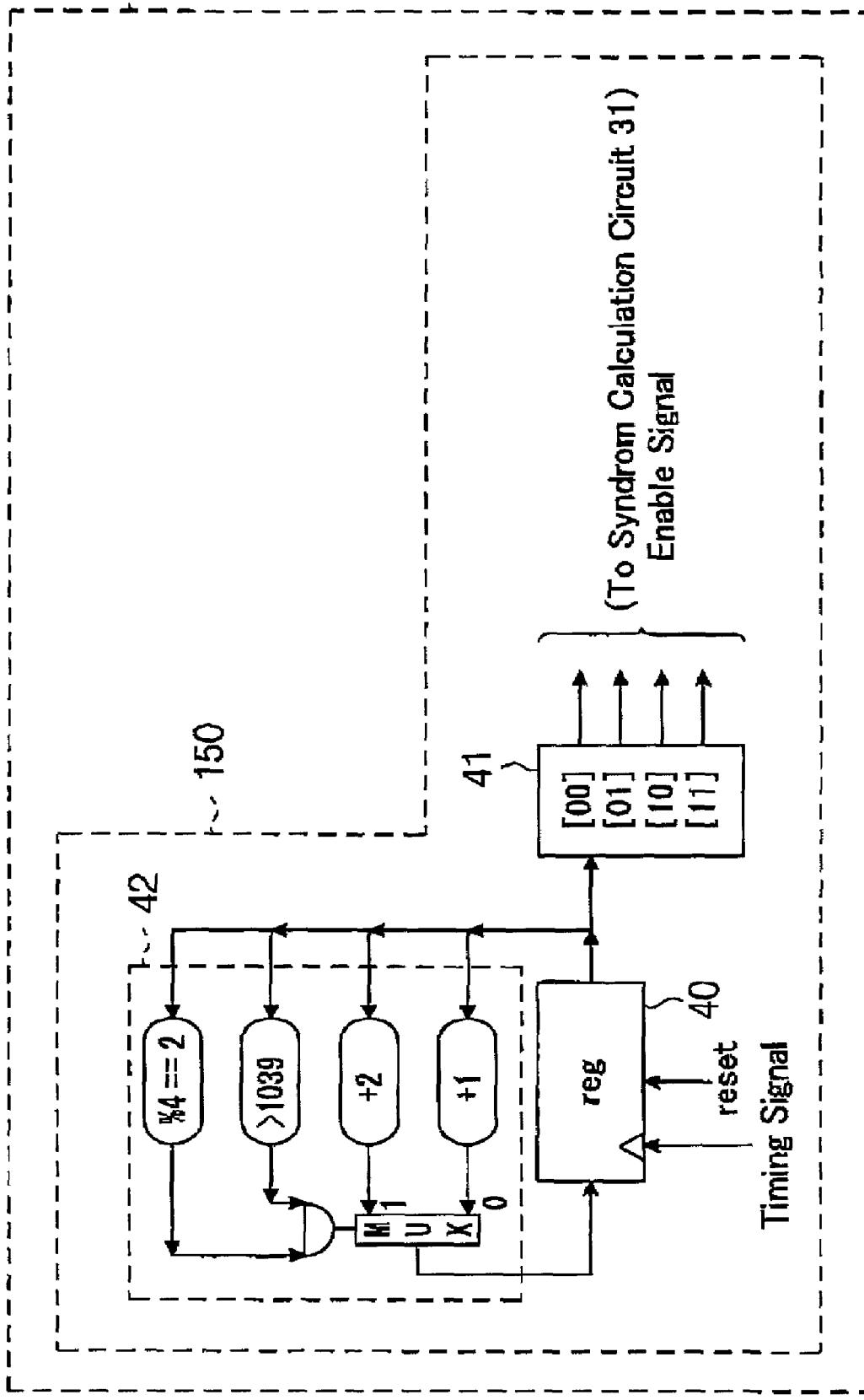
FIG. 8 is a schematic block diagram of a symbol counter of the error correction apparatus of FIG. 6.

The error correction timing generation circuit 20 controls the timing for reading code words from the DRAM 10 and the timing for calculating the syndrome with the syndrome generation circuit. Referring to FIG. 8, the error correction timing generation circuit 20 includes a symbol counter 150 for allocating the data selectively read from the DRAM 10 by each operational circuit.

The symbol counter 150, which includes a register 40, a count control circuit 42, and a decoder 41, increments a count value in accordance with, for example, the signal of a CAS or the like (the signal synchronized with the timing for reading data from the DRAM 10). The lower two digits "00", "01", "10", "11" of the count value of the symbol counter 150 respectively correspond to four code words. The data read from the DRAM 10 is selectively distributed to a plurality of operational circuits based on the count value.

The register 40 temporarily holds the count value generated by the count control circuit 42 and provides the count value to the decoder 41 and the count control circuit 42 in synchronism with the timing signal (e.g. CAS signal). Based on the lower two digits of the count value, the decoder 41 selectively provides an enable signal to the registers of the operational circuits S00, S10, the registers of the operation circuits S01, S11, the registers of the operational circuits S02, S12, and the registers of the operational circuits S03, S13. The syndromes of the four code words are calculated by the operational circuits in response to the enable signal.

The count control circuit 42 receives a count value from the register 40, adds "1"or "2" to the count value, and provides the added count value to the register 40. When the count value is "0000" to "1039", "1" is added to the count value (i.e., the count value is incremented) When the count value reaches "1040", "1" or "2" is added to the count value based on the lower two digits of the count value. When the lower two digits of the count value is "0" or "01", "1" is added to the count value. When the lower two digits of the count value is "10", "2" is added to the count value to set the lower two digits of the count value to "00". By controlling the count value, the lower two digits of the count value is prevented from being "11" when the count value is "1040" or greater.

When the symbols of 1040 bytes are read, only three code words remain as shown in FIG. 5. Thus, in synchronism with the timing for reading data from the DRAM 10 and the timing of the three code words, the registers of the operational circuits S00, S10, the registers of the operational circuits S01, S11, and the registers of the operational circuits S02, S12 are selectively activated to calculate the syndromes of the three code words in parallel.

When 26 symbols are distributed to each operational circuit and the syndrome of each code word is calculated, the error correction timing generation circuit 20 generates a clear signal to initialize the operational circuit. By providing the operation circuit with the clear signal, the operational circuit generates a new syndrome based on the symbol.

The error correction timing generation circuit 20 includes a counter for providing a reset signal to the symbol counter 150 of FIG. 8 when determining that a sector of data has been read from the DRAM 10. In this manner, the counter value of the symbol counter 150 is initialized when it is determined that a sector of data has been read from the DRAM 10. Accordingly, the enable signal is generated without causing the configuration of the symbol counter 150 to be complicated.

The timing for accessing the DRAM 10 and the timing for calculating the syndrome will now be discussed with reference to FIGS. 9(a) to 9(o).

Figure 9:
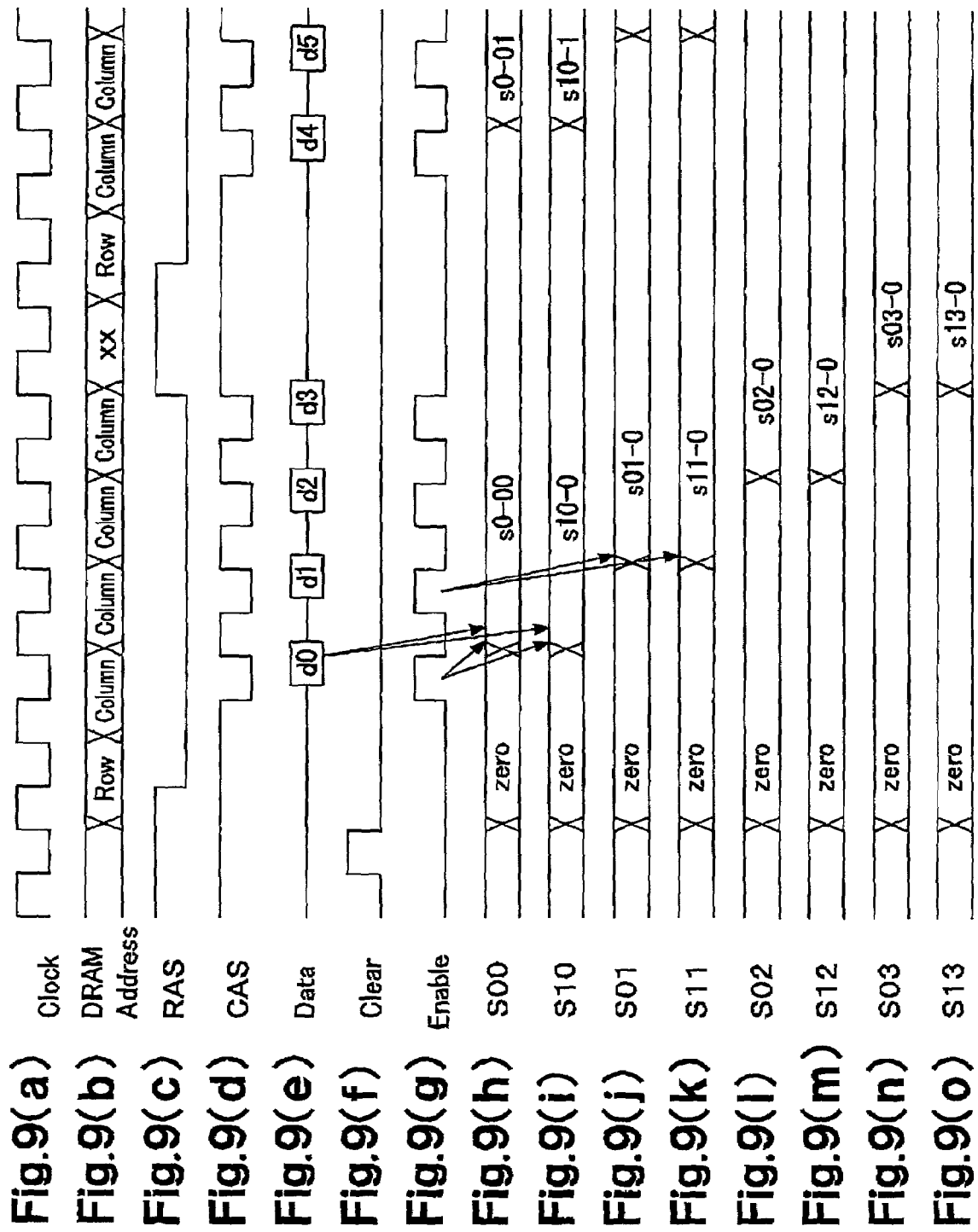
FIGS. 9(a) to 9(o) are time charts illustrating the timing for reading a code word of the error correction apparatus of FIG. 6.

When the error correction timing generation circuit 20 provides the syndrome generation circuit 31 with a clear signal (FIG. 9(f)) in synchronism with a predetermined clock signal (FIG. 9(a)), the operational circuits S00, S10, the operational circuits S01, S11, the operational circuits S02, S12, and the operational circuits S03, S13 are initialized. This enables each operation circuit to perform a new syndrome calculation.

Then, to designate the address of the data read from the DRAM 10, the RAS signal (FIG. 9(c)) and the CAS signal (FIG. 9(d)) are generated by the bus arbiter 11. The row address of the DRAM 10 is designated when the RAS signal goes low, and the column address is designated when the CAS signal goes low. The designated row and column addresses are held until the RAS signal and the CAS signal go low the next time The RAS signal is maintained at a constant level (low level) (i.e., the row address is maintained) until the CAS signal designates four column addresses Accordingly, the data of four code words (d0, d1, d2, d3) is read (FIG. 9(e)) in synchronism with the trailing edge of the CAS signal. The error correction timing generation circuit 20 generates an enable signal (FIG. 9(g)) and calculates the syndrome with the operational circuit of the syndrome generation circuit 31 using the read data. That is, the enable signal processes the data d0 with the operational circuits S00, S10 (FIGS. 9(h) and 9(i)), the data d1 with the operational circuits S01 and S11 (FIGS. 9(j) and 9(k)), the data d2 with the operational circuits S02, S12 (FIGS. 9(j) and 9(m)), and the data d3 with the operational circuits S03, S13 (FIGS. 9(n), 9(o)).

After reading the data d0, d1, d2, d3, the RAS signal and the CRS signal go high, and the DRAM 10 performs a precharge operation (as indicated by xx in FIG. 9(b)). After the precharge operation, the RAS signal and the CAS signal go low again, and a predetermined address of the DRAM 10 is accessed to read data.

Figure 4:
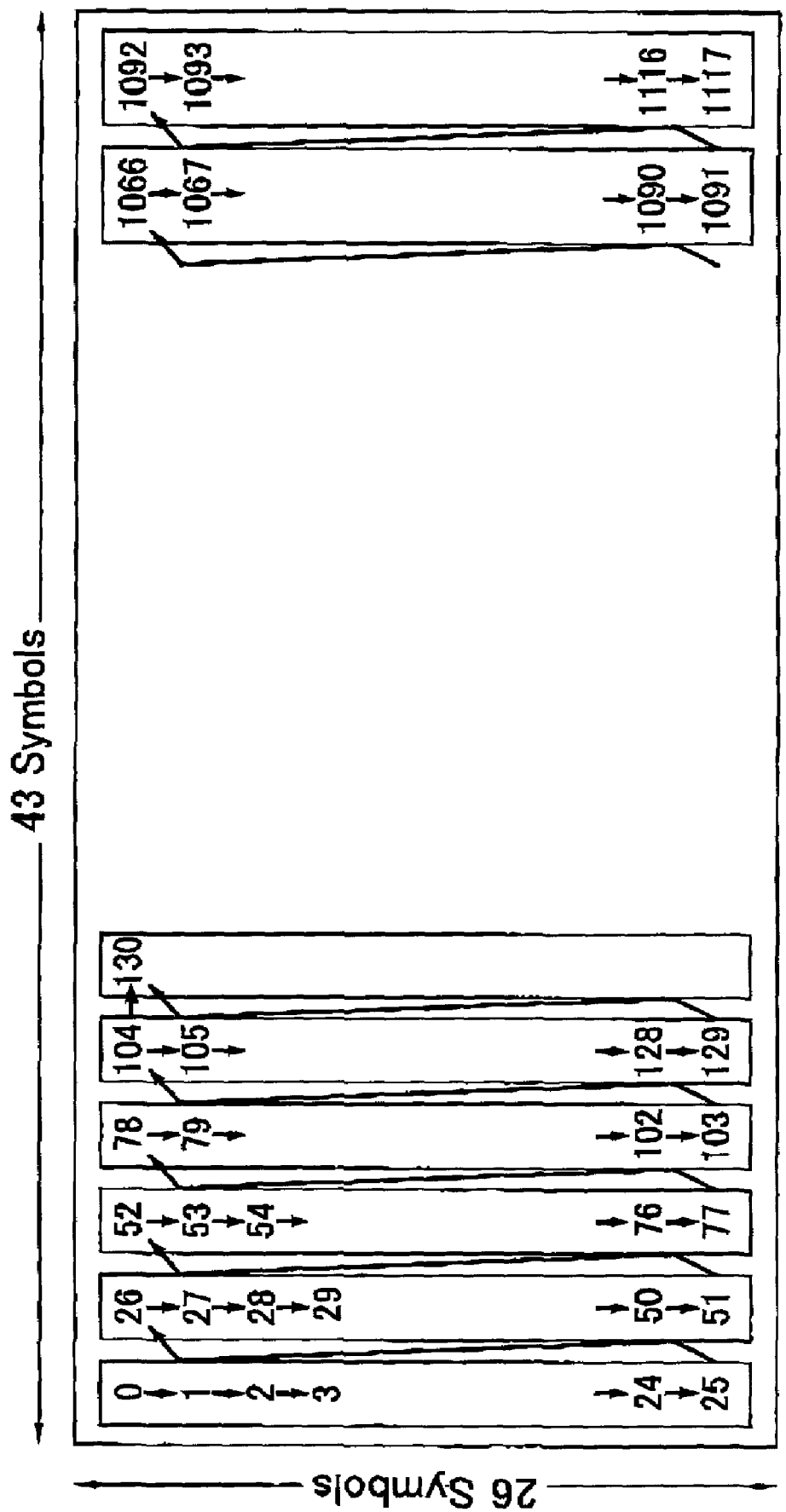
FIG. 4 is a diagram illustrating the order for reading the prior art code word.
Figure 10:
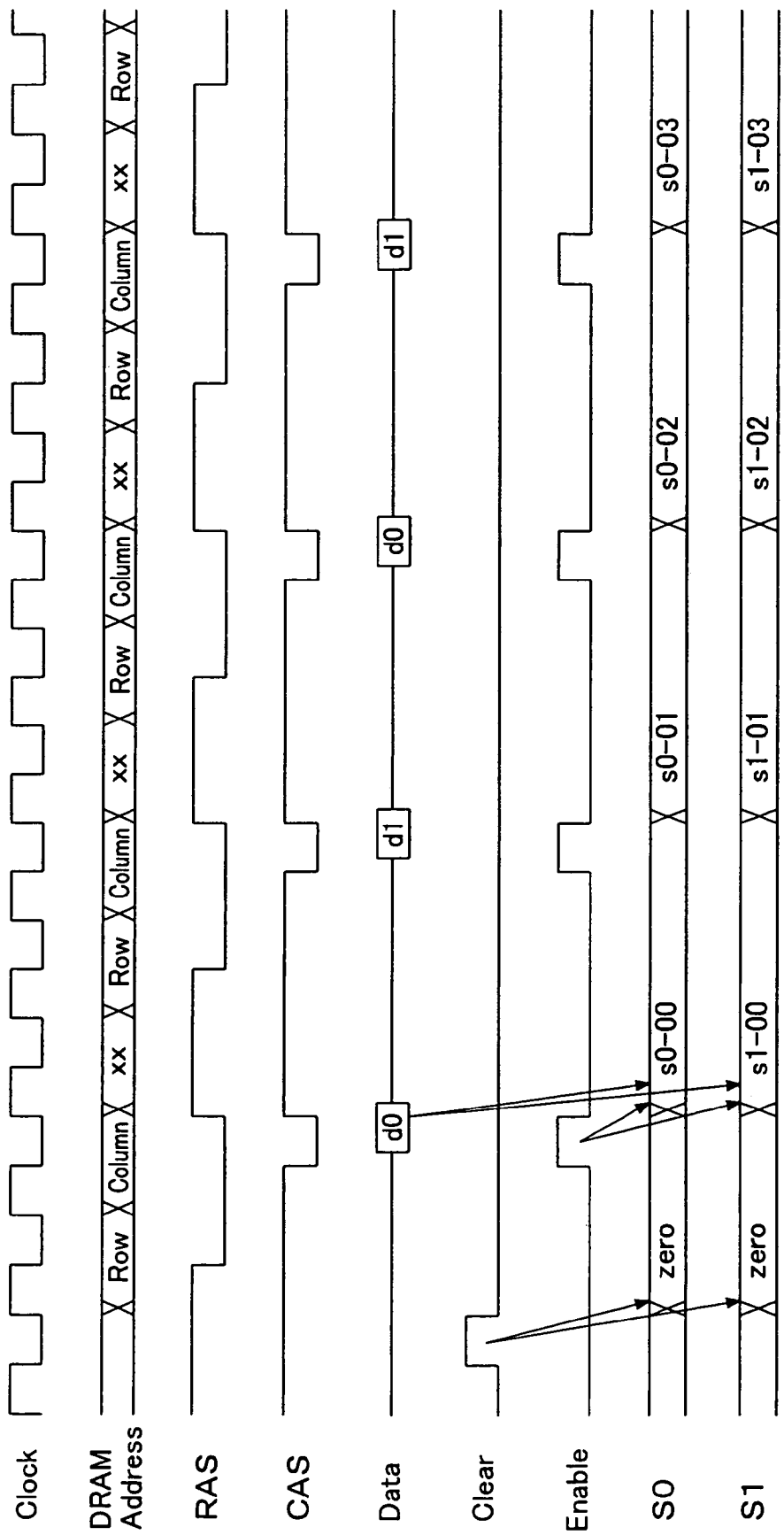
FIG. 10 is a time chart illustrating the timing for reading the prior art code word.

In this manner, four pieces of data are read with 6 clock signals by designating the column address to which the four code words belong after designating the row address. In comparison, in the prior art method of FIG. 4 in which data is read for one code word at a time, the DRAM 10 is accessed as shown in FIG. 10. More specifically, each piece of data that is subject to reading requires three (3) clock signals, those for designating the row address and the column address of the DRAM 10 with the RAS signal and the CAS signal and that for performing the precharge operation (indicated as xx). Accordingly, when reading four pieces of data, 12 clock signals are necessary. Thus, the time for reading four pieces of data is twice as long in comparison with the preferred embodiment.

As shown in the example of FIG. 11, if two column addresses are designated by the CAS signal in the preferred embodiment, the page boundary detection circuit 24 generates a page boundary signal SB when the column address indicates a page boundary of the DRAM 10. Tn response to the page boundary signal SB, the RAS signal and the CAS signal go high and the precharge operation (indicated by xx) is performed. Then, after designating a row address again with the RAS signal, the CAS signal designates a column address to read the two pieces of data d2, d3.

The error correction apparatus of the preferred embodiment has the advantages discussed below.

(1) A plurality of P codes are consecutively read from the DRAM 10. Thus, after designating the row address, the page mode technique, which consecutively designates column addresses, may be applied. This shortens the time the DRAM 10 is accessed.

(2) The page boundary detection circuit 24 detects whether the data subject to reading is at the boundary of a page. This guarantees that the processing based on the page mode technique is performed.

(3) The syndrome generation circuit 31 processes four code words in parallel. Thus, syndrome calculation is performed within a short period of time.

(4) After the 1040 MS bytes and 1040 LS bytes are read, the symbol counter provides the enable signal only to the operational circuits S00, S10, the operational circuits S01, S11, and the operational circuits S02, S12. This guarantees the reading of the code word even it the total number of code words is not a multiple of the number of code words that are read consecutively.

(5) The multiplexers M1, M2 distribute the error detection circuit 34 with syndromes, which are generated by processing four code words in parallel. This prevents the circuit area of the error detection circuit 34 from increasing.

It should be apparent to those skilled in the art that the present invention may be embodied in many other specific forms without departing from the spirit or scope of the invention. Particularly, it should be understood that the present invention may be embodied in the following forms.

(a) The page size of the DRAM 10 is not limited to 256 bytes. When changing the page size, the page boundary detected by the page boundary detection circuit 24 is also changed.

(b) Instead of the symbol counter, a read only memory (ROM) may provide the enable signal.

Figure 2:
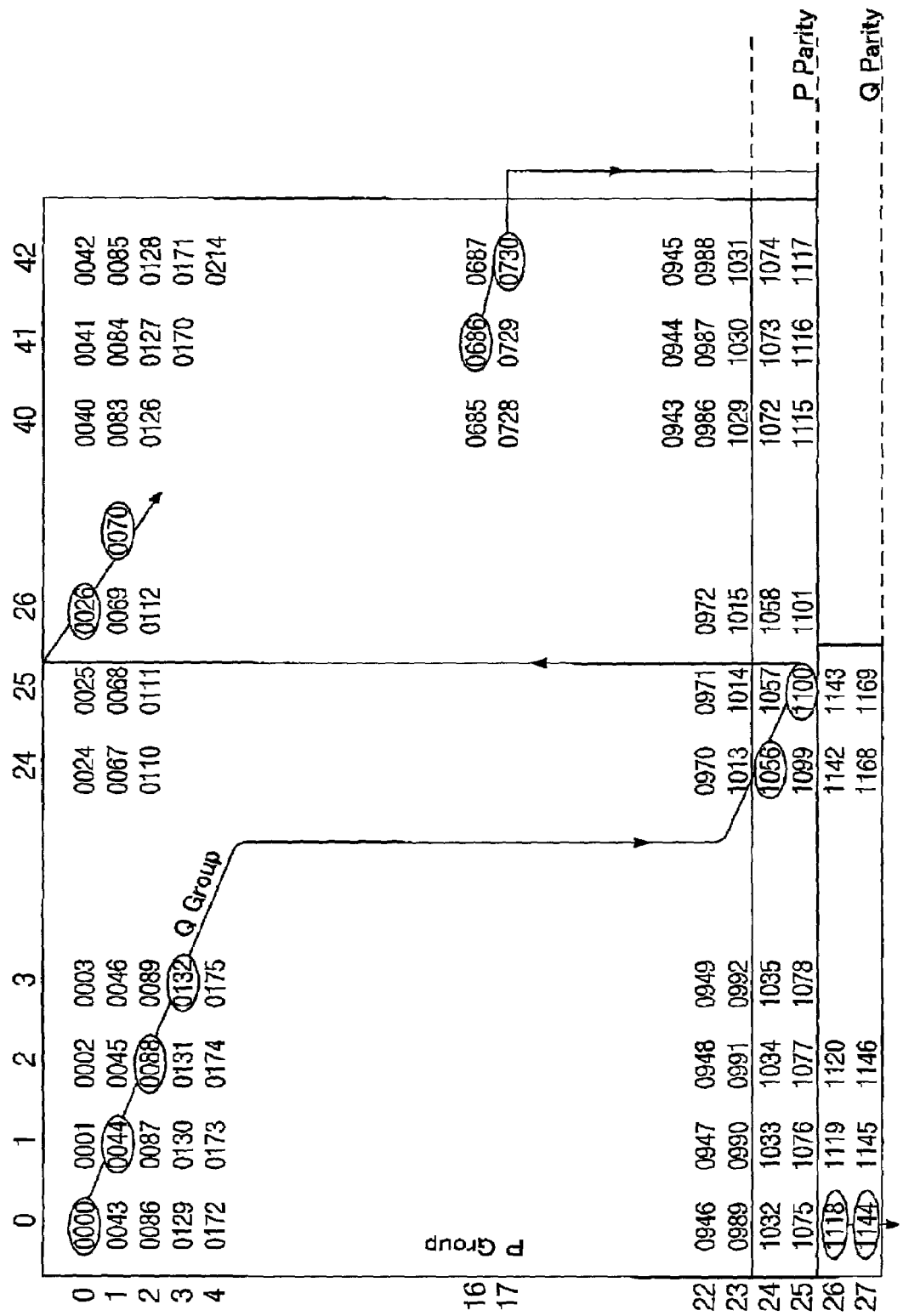
FIG. 2 is a diagram illustrating a code word of a prior art CD-ROM.

(c) The application of the present invention is not limited to consecutive reading of the P codes. The present invention may also be applied to consecutive reading of the Q codes. In such a case, when the Q codes are first read, it is preferred that the data of a single word code be first read and that the data of multiple code words be read afterward. More specifically, referring to FIG. 2, it is preferred that "0000" be first read, "0043" and "0044" be read next, and "0086", "0087", and "0088" be read afterward. In the subsequent processing, the data of four code words (e.g., "0129", "1130", "0131", and "0132") are read consecutively. In such case, the process for providing the syndrome generation circuit 31 with the enable signal and the clear signal is changed as required.

(d) The application of the invention is not restricted to the error correction process of a CD-ROM. The present invention may also be applied to an error correction process of a CD or a digital versatile disc (DVD).

(e) The number of code words read consecutively and the number of syndromes calculated in parallel are not restricted as described in the preferred embodiment. Further, the symbol of code words read consecutively does not have to be stored adjacent to a random access memory.

(f) When consecutively reading plural code words, a high speed access technique, such as the extended data output (EDO) technique, may be employed in lieu of the page mode technique. Further, a synchronous DRAM (SDRAM) may be used in lieu of the DRAM.

(g) The multiplexers M1 and M2 may be eliminated.

The present examples and embodiments are to be considered as illustrative and riot restrictive, and the invention is not to be limited to the details given herein, but may be modified within the scope and equivalence of the appended claims.

What is claimed is:

1. An error correction apparatus for performing an error correction process on digital data that is stored in a buffer memory and includes multiple code words, the apparatus comprising:
    a memory access circuit for controlling reading and writing of the code words to the buffer memory;
    a symbol counter for counting the number of symbols of the code words read from the buffer memory and generating a count value of a plurality of bits;
    a plurality of operational circuits for performing a syndrome calculation with each of the multiple code words read from the buffer memory; and
    an error correction circuit for performing an error correction process on the multiple code words read from the buffer memory based on the syndrome calculation performed by the plurality of operational circuits, wherein the memory access circuit consecutively reads the multiple code words from the buffer memory and distributes the read code words to the plurality of operational circuits based on the count value of the lower two bits of the plurality of bits;

wherein the symbol counter includes:
    a register for holding the count value;
    a decoder for distributing the symbols read from the buffer memory to the plurality of the operational circuits in accordance with the count value of the lower two bits; and
    a count control circuit for altering the count value in accordance with a timing for reading the symbols.

2. The apparatus according to claim 1, wherein each of the code words is formed by multiple symbols, and the memory access circuit reads the symbols of the code words.

3. The apparatus according to claim 1, wherein the count control circuit changes an adding condition of the count value when the count value exceeds a predetermined value.

4. The apparatus according to claim 1, wherein the memory access circuit holds a row address of the buffer memory and changes a column address for each code word to consecutively read the multiple code words from the buffer memory.

5. An error correction apparatus for performing an error correction process on digital data that is stored in a buffer memory and includes multiple code words, the apparatus comprising:
    a memory access circuit connected to the buffer memory for reading and writing the code words to the buffer memory in accordance with an address signal;
    an address generation circuit for generating the address signal to designate an address of the code words read from and written to the buffer memory and for providing the address signal to the memory access circuit;
    a timing generation circuit connected to the address generation circuit for generating a timing signal to control the address generation circuit so that the address signal is generated to read the code words from the buffer memory;
    a symbol counter for counting the number of symbols of the code words read from the buffer memory and generating a count value of a plurality of bits;
    a detection circuit for detecting a page boundary signal by detecting a page boundary of the digital data based on the address signal generated by the address generation circuit;
    a syndrome generation circuit for generating multiple syndromes in parallel in correspondence with the multiple code words by processing the code words of the digital data read from the buffer memory based on the count value of the lower two bits of the plurality of the plurality of bits; and
    an error correction circuit for performing an error correction process on the multiple code words read from the buffer memory based on the multiple syndromes generated by the syndrome generation circuit.

6. The apparatus according to claim 5, wherein the address signal includes a row address signal and a column address signal, and the control circuit controls the address generation circuit so that a plurality of the column address signal corresponding to the multiple code words are consecutively generated after the row address signal is generated.

7. The apparatus according to claim 5, wherein the timing generation circuit generates the timing signal to control the address generation circuit so that the address signal changes in accordance with the page boundary signal.

8. The apparatus according to claim 5, wherein the syndrome generation circuit includes a plurality of operational circuit generating the syndromes in parallel.

9. A method for performing an error correction process on digital data that is stored in a buffer memory and includes multiple code words, the method comprising the steps of:

consecutively generating an address signal to read the code words of the digital data from the buffer memory;

consecutively reading the code words of the digital data from the buffer memory in accordance with the address signal;

generating a page boundary signal by detecting a page boundary of the digital data based on the address signal;

counting the number of symbols of the code words read from the buffer memory to generate a count value of a plurality of bits;

distributing the read code words to a plurality of operational circuits based on the count value of the lower two bits of the plurality of bits;

generating multiple syndromes in parallel by processing the code words of the digital data read from the buffer memory using the plurality of operational circuits; and performing the error correction process on the code words of the digital data read from the buffer memory using the multiple syndromes.

10. The method according to claim 5, wherein the address signal includes a row address signal and a column address signal, and the step for generating an address signal includes generating a row address signal and then consecutively generating a plurality of the column address signals corresponding to the multiple code words.

11. The method according to claim 9, further comprising the step of: changing the address signal in accordance with the page boundary signal.

* * * * *